United States Patent
Hu

(10) Patent No.: US 6,689,685 B2
(45) Date of Patent: Feb. 10, 2004

(54) PROCESS FOR FORMING A DIFFUSION BARRIER MATERIAL NITRIDE FILM

(75) Inventor: Yongjun Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/271,259

(22) Filed: Oct. 15, 2002

(65) Prior Publication Data

US 2003/0045046 A1 Mar. 6, 2003

Related U.S. Application Data

(60) Division of application No. 09/812,099, filed on Mar. 19, 2001, now Pat. No. 6,479,381, which is a continuation of application No. 08/862,685, filed on May 23, 1997, now Pat. No. 6,204,171, which is a continuation-in-part of application No. 08/653,428, filed on May 24, 1996, now Pat. No. 5,633,200.

(51) Int. Cl.$^7$ ................................................. H01L 21/44
(52) U.S. Cl. ........................ 438/653; 438/730; 438/775
(58) Field of Search ................................. 438/627, 648, 438/653, 656, 685, 730, 775

(56) References Cited

U.S. PATENT DOCUMENTS 5,631,479 A * 5/1997 Shiga

* cited by examiner

Primary Examiner—David Nelms
Assistant Examiner—Phuc T. Dang
(74) Attorney, Agent, or Firm—Workman Nydegger

(57) ABSTRACT

A process is disclosed for manufacturing a film that is smooth and has large nitride grains of a diffusion barrier material. Under the process, a nitride of the diffusion barrier material is deposited by physical vapor deposition in an environment of nitrogen. The nitrogen content of the environment is selected at an operating level such that nitride nuclei of the diffusion barrier material are evenly distributed. A grain growth step is then conducted in the nitrogen environment to grow a film of large nitride grains of the diffusion barrier material. Also disclosed is a stack structure suitable for MOS memory circuits incorporating a lightly nitrided refractory metal suicide diffusion barrier with a covering of a nitride of a diffusion barrier material. The stack structure is formed in accordance with the diffusion barrier material nitride film manufacturing process and exhibits high thermal stability, low resistivity, long range agglomeration blocking, and high surface smoothness.

20 Claims, 3 Drawing Sheets

PROCESS FOR FORMING A DIFFUSION BARRIER MATERIAL NITRIDE FILM

This is a divisional of U.S. patent application Ser. No. 09/812,099, filed on Mar. 19, 2001, now U.S. Pat. No. 6,479,381 which is a continuation of U.S. patent application Ser. No. 08/862,685, filed on May 23, 1997, now U.S. Pat. No. 6,204,171, which is a continuation-in-part of U.S. patent application Ser. No. 08/653,428, filed on May 24, 1996, now U.S. Pat. No. 5,633,200, which are incorporated herein by reference.

BACKGROUND OF THE INVENTION

1. The Field of the Invention

The present invention relates to the formation of a film substantially composed of a nitride of a diffusion barrier material situated on a semiconductor substrate. More particularly, the present invention is directed to the formation of a large grain diffusion barrier material nitride film situated on a semiconductor substrate in a process suitable for forming a diffusion barrier and for forming a refractory metal silicide stack structure with a diffusion barrier material nitride cover layer.

2. The Relevant Technology

In the manufacturing of an integrated circuits upon a semiconductor substrate, barriers are often needed to prevent the diffusion of one material to an adjacent material. For instance, when aluminum contacts silicon surfaces, spiking can occur, and when aluminum comes into direct contact with tungsten, a highly resistive alloy is formed. Diffusion barriers are structures commonly used to prevent such undesirable reactions.

In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

Titanium nitride has formerly been the material of choice for forming diffusion barriers and adhesive layers where conductive interfaces must be maintained. More recently, however, tungsten nitride has begun to appear more favorable and is in many applications replacing titanium nitride. Tungsten nitride has advantages over titanium nitride in that it has a lower resistivity and is thus more suitable for use in conductive interfaces in high speed applications. It is also more thermally stable, making it more suitable for the high temperature processing common in integrated circuit manufacturing.

One conventional method of forming tungsten nitride diffusion barriers is with chemical vapor deposition (CVD). Conventional chemical vapor deposition processes react tungsten with gaseous nitrogen at a high temperature in atmosphere of fluorine to form a film of tungsten nitride. Problems attendant to this process include the detrimental tendency of the fluorine to attack exposed surfaces of semiconductor substrates on which the diffusion barrier is being formed. The lack of cleanliness of chemical vapor deposition processes also presents problems. Consequently, the art has looked to other methods of depositing tungsten nitride films.

Physical vapor deposition (PVD) is another convention method of forming tungsten nitride diffusion barriers and is an alternative to the use of chemical vapor deposition for depositing tungsten nitride. The conventional physical vapor deposition technology involves reactive sputtering from a tungsten target in an atmosphere of gaseous nitrogen with an argon carrier gas. In this conventional saturated reactive sputtering mode, the volume ratio of nitrogen ($N_2$) to the argon carrier gas is selected such that the tungsten target is fully nitrided by surface dissociated nitrogen.

This type of conventional PVD process is highly reactive and causes simultaneous high density, nonuniform nucleation and grain growth, and results in a highly columnar, small grain film with a high resistivity. The small grain size, when the grains come into contact with adjacent layers such as aluminum which is of a large grain size, tends to cause stress at the interface between the layers and can cause the layers to peel away from each other. Also, the high amount and irregularity of the grains formed by the conventional process tend to cause voids, which give rise to electromigration and consequently, reduced diffusion barrier abilities. Voids are especially prone to forming at interfaces between adjoining layers.

A further problem with the conventional physical vapor deposition process is a columnar structure that is exhibited by the resulting film. The columnar structure, which appears as spikes between the grains, serves as a channel for diffusion and reduces the effectiveness of the columnar structure as a diffusion barrier.

One application for tungsten nitride films is the formation of diffusion barriers between the tungsten of tungsten plugs and adjoining metallization layers on the surface of the wafer. Such a diffusion barrier is shown in FIG. 1. Therein is shown a tungsten plug 14 extending down to a silicon substrate 10 with an overlying metallization layer 16 and an intervening diffusion barrier 12. The tungsten plug structure is one example of an application where tungsten nitride has been found as a suitable replacement for titanium nitride, as it is easily formed over the tungsten plug. Nevertheless, void formation and interfacial stress inherent to the conventional physical vapor deposition processes, along with the aforementioned problems associated with fluorine processing and cleanliness for chemical vapor deposition processes are detriments to the use of tungsten nitride for such applications.

A further application where an improved method for forming tungsten nitride films could be favorably used is in the formation of low resistivity tungsten nitride/titanium silicide stack. A titanium silicide ($TiSi_2$) self aligned diffusion barrier, known as titanium silicide, is formed by sputtering titanium on a polysilicon and annealing the deposited titanium at 650° C. after masking in a gaseous nitrogen environment to form titanium silicide in a C-49 phase. A second anneal at 850° C. transforms the titanium silicide to a more thermally stable C-54 phase and is followed by a standard wet strip. Titanium silicide stacks are commonly used for forming word and bit lines in DRAM memory structures and for forming local interconnects to CMOS gate structures.

The problems exhibited by conventional titanium silicide structures include agglomeration at the titanium silicide and polysilicon interface and decomposition of the titanium silicide back into titanium and silicon at high temperatures that results in high resistivity.

A need exists for a process of forming a film substantially composed of a nitride of a diffusion barrier material which overcomes the problems existing with conventional chemical vapor deposition and physical vapor deposition processes, and which can be used to form a suitable diffusion barrier that has low resistivity, large grain size, low interfacial stress, and which is thermally stable. Such a process would be beneficial if it were compatible with and solved the aforementioned problems existent with processes for forming the titanium silicide stack structure.

SUMMARY OF THE INVENTION

The present invention seeks to resolve the above and other problems that have been experienced in the art. More particularly, the present invention constitutes an advancement in the art by providing a process for forming a film that is substantially composed of a nitride of a diffusion barrier material. The diffusion barrier material is substantially composed of a material selected from a group consisting of tungsten alloys of Group III and Group IV early transition metals and molybdenum alloys of Group III and Group IV early transition metals. The present invention provides a process for forming the nitride of the diffusion barrier material having a grain size in a range from about 1000 Angstroms to about 2000 Angstroms, where the diffusion barrier material nitride film has a substantially crystalline structure and a peak-to-valley roughness of less than about ten percent of the thickness thereof.

In accordance with the invention as embodied and broadly described herein in the preferred embodiment, a process is provided for manufacturing a nitride of a diffusion barrier material with physical vapor deposition (PVD) which results in a large grain, low stress film. Also provided are applications of the nitride of a diffusion barrier material such as a cover layer for a refractory metal silicide stack, where the refractory metal silicide stack is nitrided.

The inventive process for forming the film composed of a nitride of a diffusion barrier material includes providing a surface layer located on a semiconductor substrate. A layer of a diffusion barrier material is sputtered on the surface layer in an environment comprising a gaseous nitrogen content. The gaseous nitrogen content is selected such that a nucleation of a nitride nuclei of the diffusion barrier material is incorporated in the layer of the diffusion barrier material. There will preferably be between about $4 \times 10^8$ to about $4 \times 10^{15}$ nitride nuclei of the diffusion barrier material per $cm^2$ of the diffusion barrier material.

After the diffusion barrier material is deposited, grains are grown of a nitride of the diffusion barrier material in the layer of the diffusion barrier material in an environment containing nitrogen to form a layer of a nitride of the diffusion barrier material.

In another application, a contact plug is formed having an end upon an active area in a semiconductor substrate and an opposite end with a surface layer thereon. A layer of a diffusion barrier material is sputtered on the surface layer in an environment comprising a gaseous nitrogen content. The gaseous nitrogen content is selected such that a nucleation of a nitride nuclei of the diffusion barrier material is incorporated in the layer of the diffusion barrier material, wherein there is between about $4 \times 10^8$ to about $4 \times 10^{15}$ nitride nuclei of the diffusion barrier material per $cm^2$ of the diffusion barrier material. The diffusion barrier material is substantially composed of a material selected from a group consisting of tungsten alloys of Group III and Group IV early transition metals and Mo alloys of Group III and Group IV early transition metals.

After the nitride nuclei of the diffusion barrier material are formed, grains are grown of a nitride of the diffusion barrier material in the layer of the diffusion barrier material in an environment containing nitrogen to form a layer of a nitride of the diffusion barrier material. Next, a metallization layer is formed upon the layer of the nitride of the diffusion barrier material.

The general process of the present invention for manufacturing film substantially composed of a nitride of a diffusion barrier material comprises in a first step, producing an underlying surface layer upon which the diffusion barrier material film is to be formed. The underlying surface layer may comprise refractory metal, as when forming a diffusion barrier between a refractory metal plug and an overlying aluminum interconnect line, or the underlying layer may be doped silicon, polysilicon, titanium, or any other suitable material for semiconductor applications.

In a further step, the diffusion barrier material is deposited on the underlying layer using unsaturated physical vapor deposition reactive sputtering in a nitrogen environment so that a nitride of the diffusion barrier material results. This is typically conducted in a physical vapor deposition chamber with parameters known in the art.

In one embodiment, a gaseous mixture of nitrogen in an argon carrier is selected and passed into the PVD chamber. The gaseous mixture is selected to have an optimum nitrogen content level that causes a light nucleation of the nitride of the diffusion barrier material and which results in no refractory metal nitride grain growth. A light, highly uniform nucleation of the nitride of the diffusion barrier material results from the low nitrogen content which is uniformly distributed to serve as nuclei for later grain growth. Thus, the PVD process is used as a uniform nucleation process but not a grain growth process.

The optimum nitrogen content level is the nitrogen/argon gas mixture that causes surfaces adjacent to the target such as side shields to be substantially coated with nitrogen from the nitrogen environment, but cause the target to be only lightly coated.

Examples of mixtures for forming the nitrogen environment include, for example, diatomic nitrogen in a plasma driven process, diatomic nitride, and nitrous oxide in an argon carrier gas.

In order to determine the optimum nitrogen content operating level, the following steps are performed. First, using the physical vapor deposition chamber and operating parameters that will be used during the deposition, the diffusion barrier material deposition rate is experimentally calculated as a function of the nitrogen content in the physical vapor deposition chamber environment and plotted, with the diffusion barrier material deposition rate being plotted on one axis and the nitrogen content from 0 to approximately 100% volume ratio in argon being plotted on the second axis. The resulting plot will have a curve that starts out with a slight taper, drops sharply, and then tapers out and substantially levels off again at the bottom. This curve will occur at different levels of nitrogen content and differing diffusion barrier material deposition rate levels, but the characteristic slope of the curve with the sharp drop and leveling off at the bottom has been found to be consistent at different power levels and operating parameters and within various chambers.

The nitrogen content operating level is selected to correspond to just prior to the point on the plot of the steepest deposition rate slope in the downward direction, which also corresponds approximately to the point of maximum rate of change of the slope in the downward direction. Once the nitrogen content operating level has been selected, the diffusion barrier material deposition is conducted within the physical vapor deposition chamber to form a diffusion barrier material film with lightly nucleated and uniformly distributed nitride seeding of the diffusion barrier material.

The next step is to grow a near epitaxial quality crystalline diffusion barrier material nitride structure from the diffusion barrier material film. This is known as "grain growth." The grain growth step is conducted by heating the diffusion barrier material film in a nitrogen environment, typically to a temperature of between about 600° C. and 700° C., and using a rapid thermal nitridization process.

The resulting diffusion barrier material nitride film exhibits large grain structure that will result in low stress to adjoining layers, a high surface smoothness, and a high thermal stability, thus providing the capability of serving as an improved diffusion barrier.

One application of the diffusion barrier material nitride film of the present invention is to form a cover layer to a silicide layer of a refractory metal, such as titanium. When so doing, the first step is to form an underlying layer on which to form the refractory metal silicide. The underlying layer is typically polysilicon, though it could also comprise doped silicon, or other suitable layers. The underlying layer is lightly nitrided in an ion implantation tool.

Subsequently, a refractory metal film, such as titanium, is deposited over the underlying layer using physical vapor deposition in an environment of light nitridization. The light nitridization typically comprises a volume of nitrogen of up to about 3% in an inert carrier gas such as argon.

In a further step, the lightly nitrided refractory metal film is annealed in an atmosphere of nitrogen to form a nitride of the refractory metal. In a typical process, this comprises a first anneal at about 650° C. followed by a stripping of unreacted refractory metal remaining on the surface, and a second anneal conducted at approximately 850° C., which transforms a silicide of the refractory metal to a less resistive and more thermally stable phase species.

Diffusion barrier material is then deposited in accordance with the process for manufacturing a diffusion barrier material film as described above, and is grown into a nitride of the diffusion barrier material, also in accordance with the process as described above.

The resulting lightly nitrided refractory metal silicide structure exhibits beneficial qualities for use in structures such as word and bit lines and interconnect access lines, with a reduced tendency to decompose or agglomerate over time due to nitridization which forms in grain boundaries and inhibits grain boundary movement. AFM studies have shown that grain uniformity is highly improved, as is surface smoothness and thermal stability during rapid thermal annealing at 650° C. and 850° C. after the refractory metal strip. The addition of the nitride of the diffusion barrier material cover layer produces a large grain structure at the surface which is resistant to deposition at high temperatures and exhibits stability up to 850° C. in furnace anneals and 1000° C. in rapid thermal anneals.

BRIEF DESCRIPTION OF THE DRAWINGS

In order that the manner in which the above-recited and other advantages of the invention are obtained will be understood, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1:
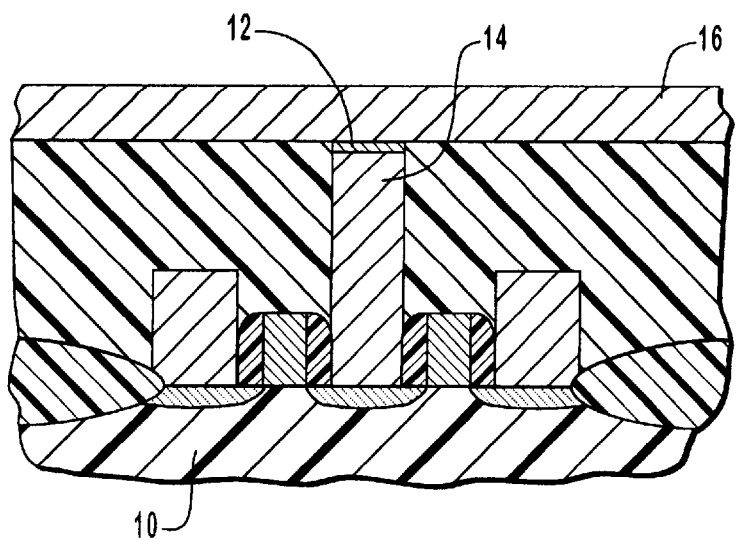
FIG. 1 is a cross-sectional depiction of a tungsten plug structure utilizing a nitride of a diffusion barrier material.

The present invention comprises a process for manufacturing films substantially composed of a nitride of a diffusion barrier material. The nitride of the diffusion barrier material is substantially composed of a material selected from a group consisting of tungsten alloys of Group III and Group IV early transition metals and Mo alloys of Group III and Group IV early transition metals. Preferably, the diffusion barrier material is substantially composed of a material selected from a group consisting of $Sc_yM_z$, $Zr_yM_z$, $Zr_xSc_yM_z$, $Zr_xNb_yM_z$, $Zr_uSc_xNb_yM_z$, $Nb_yM_z$, $Nb_xSc_yM_z$, $Ti_yM_z$, $Ti_xSc_yM_z$, $Ti_xNb_yM_z$, and $Ti_xZr_yM_z$, where M is one of tungsten and molybdenum.

The grains of the nitride of the diffusion barrier material are preferably grown to a diameter in a range from about 1000 Angstroms to about 2000 Angstroms. The films substantially composed of a nitride of a diffusion barrier material will preferably have a substantially crystalline structure and will have a smooth surface characterized by a peak-to-valley roughness of less than about ten percent of the thickness thereof. Also disclosed is an application of the process of the present invention for manufacturing a refractory metal silicide stack structure with a cover layer substantially composed of a nitride of a diffusion barrier material as described above.

The process of the present invention for manufacturing diffusion barrier material nitride films comprises the use of physical vapor deposition (PVD) to deposit a diffusion barrier material layer and to uniformly nucleate diffusion barrier material nitride seeds within the diffusion barrier material layer. This is achieved by sputtering in an environment with a low nitrogen content. Once the diffusion barrier material layer is deposited and nucleated, a large grain diffusion barrier material nitride growth process under controlled conditions is performed. In creating the environment, the nitrogen content is selected at or around an optimum nitrogen content operating level wherein the diffusion barrier material nitride is uniformly nucleated and such that no grain growth occurs in the layer of diffusion barrier material during the diffusion barrier material deposition. Thus, nucleation and growth occur at separate times in a controlled process resulting in a nucleation that is uniform, and grains that are uniform and large in size.

The first step of the process of the present invention is diffusion barrier material deposition. This is performed using physical vapor deposition reactive sputtering in a physical vapor deposition chamber. One example of a physical vapor deposition chamber suitable for this procedure is the Varian M2000 chamber.

Integral to the deposition of diffusion barrier material as a nucleation stage is setting of the nitrogen content operating level of the environment of the physical vapor deposition chamber so as to set the ratio of nitrogen to inert carrier gas during the deposition at an operating level corresponding to or close to the optimum nitrogen content operating level. While the nitrogen content operating level will vary for different PVD chambers, power levels, and other parameters, a process has been devised which can be universally and effectively applied to determine the proper nitrogen content operating level. The nitrogen content operating level is determined after experimentally plotting the curve of diffusion barrier material deposition as a function of the nitrogen content in the inert carrier gas environment for the specific physical vapor deposition chamber, power level and other fixed parameters that are to be used for deposition.

Figure 2:
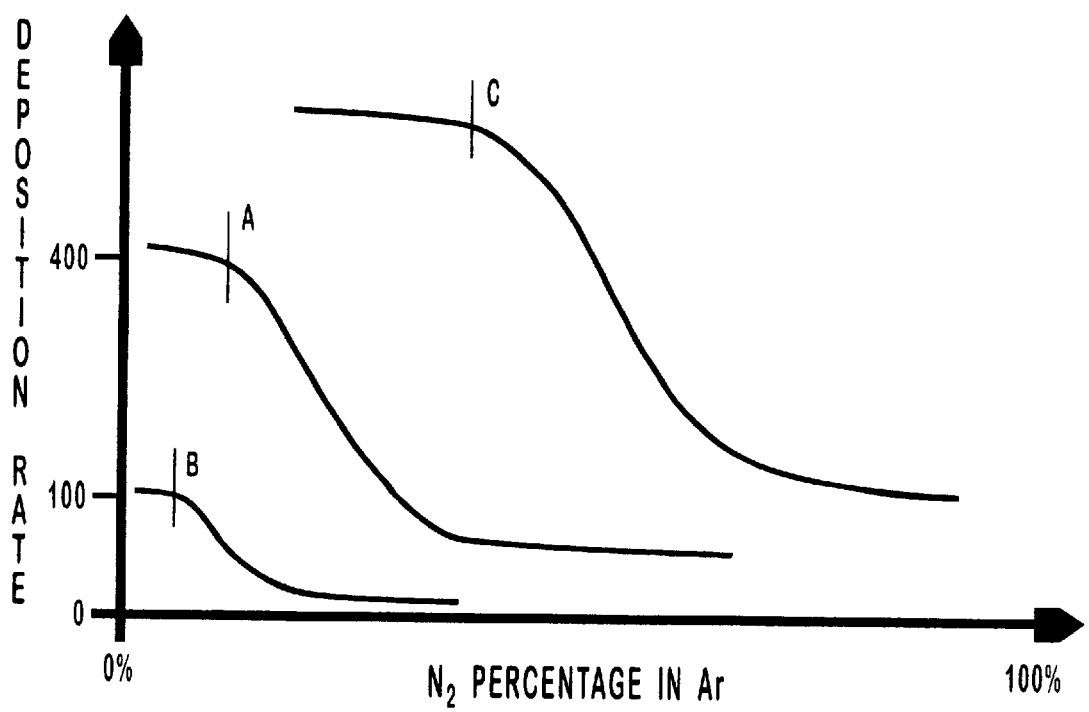
FIG. 2 is a graph plotting a diffusion barrier material deposition rate as a function of nitrogen content in a physical vapor deposition process.

A typical plot will appear as depicted in FIG. 2. Therein are shown three different curves corresponding to different power levels in the same physical vapor deposition chamber. The diffusion barrier material deposition rate is plotted on the vertical axis in Angstroms per minute, and the relative nitrogen content in an argon environment is plotted on the horizontal axis by volume percentage of nitrogen content. For each of the different power level plots, it is noted that the diffusion barrier material deposition rate initially tapers gradually downward, transitions into a steep slope, and again levels out at the bottom. Thus, each is in substantially the shape of an outward pointing elbow. Each plot has this basic characteristic curve shape, even though the curves occur at different locations on the graph. Thus, while the desired operating level will vary for the different power levels or other parameters which are used, the desired nitrogen content operating level will occur at approximately the same relative point along each curve. Points A, B and C, respectively, on each of the plots comprise the points wherein the deposition rate transitions from a slight slope to a steep slope. These points, just prior to the maximum downward slope of the plots and located at approximately the point of maximum rate of change of the slope of the curves in the downward direction, correspond to the optimum nitrogen content operating level for each respective curve.

The nitrogen content operating level need not be set at exactly the aforementioned optimum point for all operations, but it may also be set quantitatively within a broader range of within 15% of the optimum nitrogen content operating level, indicated in FIG. 2 as points A, B, and C for the respective curves. This broader range will be suitable for less demanding applications such as when forming a diffusion barrier to a smaller grained material such as titanium. A narrower, more exact range of within 3% of the optimum nitrogen content operating level is suitable for demanding applications such as larger grained aluminum which needs a better diffusion barrier and a larger grain film with less stress.

The range of settings wherein the nitrogen content is advantageous in uniform nucleation and preparation for grain growth will vary with different parameters such as power settings, as shown in the differing curves of FIG. 2. Nevertheless, the optimum nitrogen content operating level can be located by plotting the curves, and finding the transition point between a slight slope and a steep slope, as discussed above. Additionally, in locating the optimum nitrogen content operating level, it has been found than the optimum nitrogen content operating level tends to occur at the point where the maximum rate of change of deposition rate with respect to nitrogen percentage in the downward, or negative direction, occurs. That is, the optimum nitrogen content operating level corresponds to the transition points (A, B, and C), which occur at approximately the points of greatest variation in the slopes of the curves in the plot of FIG. 2.

Figure 3:
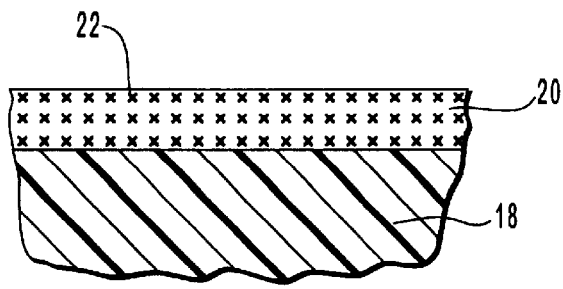
FIG. 3 is a cross-sectional depiction of a lightly nucleated diffusion barrier material film formed in a preliminary step of the process of the present invention.

The optimum nitrogen content operating level in turn corresponds to the gaseous nitrogen content which, while sufficient to form a light and uniform diffusion barrier material nitride seeding, and while sufficient to substantially coat side shields which are located in the chamber adjacent to the target, only lightly coats the target. The result of depositing diffusion barrier material at or about the optimum nitrogen content operating level is shown in FIG. 3. Thus, shown in FIG. 3 is a diffusion barrier material film 20 formed on a silicon substrate 18. Diffusion barrier material film 20, as a result of the process of the present invention, is formed with only a light nucleation of diffusion barrier material nitride 22 which is uniformly dispersed in diffusion barrier material film 20. Of course, diffusion barrier material film 20 could also be formed on a substrate other than silicon substrate 18.

When the target is substantially covered, the diffusion barrier material deposition rate is slowed. Further, diffusion barrier material nitride nucleation and grain growth occur simultaneously during deposition, and become uncontrollable. This is also known as saturation sputtering. By choosing a nitrogen content operating level close to the optimum nitrogen content operating level, the target will be only partially covered during diffusion barrier material deposition, will not yet be saturated, and a proper nucleation stage with a light, uniform nucleation of nitrogen in the layer of diffusion barrier material will be achieved. No diffusion barrier material nitride grain growth occurs in the diffusion barrier material layer during deposition, and the diffusion barrier material nuclei is prepared for a well controlled grain growth to occur in a separate step. Light nucleation is defined herein as between about $4 \times 10^8$ to about $4 \times 10^{10}$ nuclei of diffusion barrier material nitride per $cm^2$ of diffusion barrier material. The nitride nuclei of the diffusion barrier material will preferably have a diameter in a range from about 30 Angstroms to about 50 Angstroms.

The next step in the process is to grow large uniform diffusion barrier material nitride grains from the nucleated nitride of the diffusion barrier material. As a result of the light and uniform diffusion barrier material nucleation resulting from the above-described process, a uniform large grain diffusion barrier material nitride film will result from the growth stage. Grain growth is conducted in a furnace or rapid thermal nitridation chamber such as the Centura HT, available from Applied Materials company of Santa Clara, Calif. Grain growth is preferably conducted at a temperature of between approximately 600° C. and 700° C. in a rapid thermal nitridization process, wherein the temperature is ramped up quickly to a high temperature, the high temperature is sustained for a short period of time, and is then ramped back down again. Other nitridation and grain growth procedures and parameters may also be suitable. The grain growth is conducted in an environment containing a heavy content of nitrogen molecules or atomic species which may comprise, for example, $N_2$ or could comprise an atomic plasma of nitrogen. The annealing temperature can be substantially lower than 600° C., down to 400° C., for example, if a high quality atomic nitrogen environment can be maintained.

Figure 4:
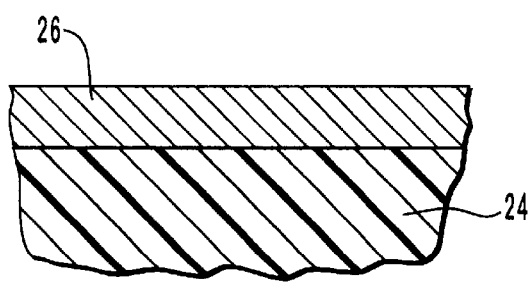
FIG. 4 is a cross-sectional depiction of a nitride of a diffusion barrier material film formed after grain growth by annealing of the nucleated diffusion barrier material film of FIG. 3 in a nitrogen-containing environment.

The result, depicted in FIG. 4, is the formation of a near epitaxial quality diffusion barrier material nitride film 26 which is suitable for use as a diffusion barrier. The film will preferably have a substantially crystalline structure and will have a smooth surface to the extent of having a peak-to-valley roughness of less than about ten percent of the thickness thereof. The film also has uniform and large grains, a non-columnar structure, and incurs low stress on adjacent layers. The grains of the nitride of the diffusion barrier material will preferably be grown in the layer of the diffusion barrier material so as to have a diameter in a range from about 1000 Angstroms to about 2000 Angstroms.

The diffusion barrier material nitride film of the present invention is highly suitable for forming an improved diffusion barrier of the type shown in FIG. 1. It has also been found to be beneficial and suitable for forming a thermally stable, low resistance, large grain cover layer for the refractory metal suicide stack structure discussed above. The thermal stability achieved is such that substantially no out diffusion of nitrogen from the layer of the nitride of the diffusion barrier material will result when heating in an environment comprising a gaseous nitrogen content within either of a furnace at a temperature up to 850° C. for a time of up to 30 minutes, or a rapid thermal nitridization process at a temperature up to 1000° C. for a time of up to 20 seconds.

Figure 5:
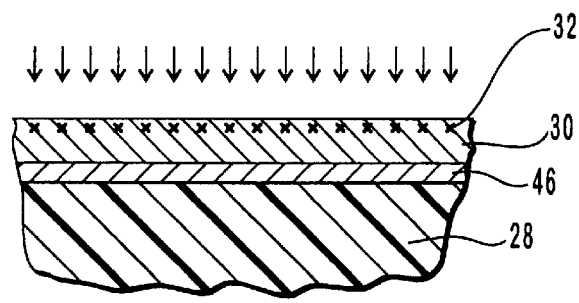
FIG. 5 is a cross-sectional depiction of a polysilicon film depicting a light nitridation on a polysilicon surface by nitrogen ion implantation.
Figure 6:
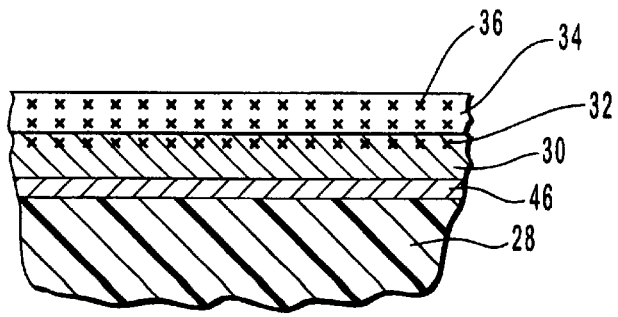
FIG. 6 is a cross-sectional depiction of the polysilicon film of FIG. 5 having a refractory metal film deposited thereon with a light nitridation.

In forming the refractory metal silicide stack structure with a diffusion barrier material nitride cover layer, the steps illustrated in FIGS. 5 through 10 are conducted. First, as shown in FIG. 5, an oxide barrier layer, such as a gate oxide layer 46 is formed on a silicon substrate 28. A surface layer such as a polysilicon film 30 is then formed on gate oxide layer 46. Next, a light nitridation of nitrogen atoms 32 is implanted into surface layer 30. The implantation of nitrogen atoms 32 is represented by arrows and is conducted using a physical vapor deposition chamber such as a Varian SHC-80 Ion Implanter. The implanter is set at a power of about 10 KeV to implement a concentration of about $10^{13}$ atoms of nitrogen per square centimeter. Phosphorous may be substituted for the nitrogen. When implanting phosphorous, the phosphorous is implanted in substantially the same quantities and with substantially the same stop range as nitrogen.

The next step, conducted without an intervening anneal, comprises depositing a refractory metal film 34, such as titanium, over polysilicon film 30. This is done in an environment containing a light amount of nitrogen, preferably comprising less than or equal to about three percent diatomic nitrogen in an inert carrier gas, such as argon, in the physical vapor deposition chamber. This yields the structure of FIG. 6. Shown therein is refractory metal film 34 with a light nitridation of nitrogen atoms 36.

Figure 7:
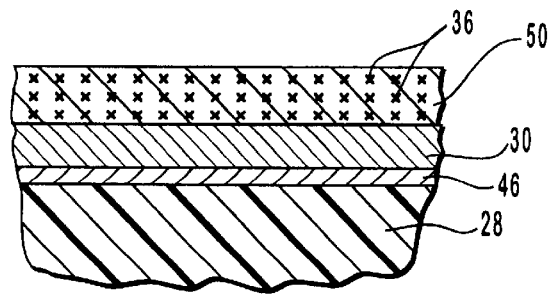
FIG. 7 is a cross-sectional representation of the polysilicon and refractory metal films of FIG. 6 after undergoing two anneal steps and a stripping of unreacted refractory metal to form a refractory metal silicide.

In a further step, the refractory metal is transformed to refractory metal silicide with a rapid thermal anneal conducted at a temperature of 650° C. The unreacted refractory metal is then stripped from the surface, and a second anneal is conducted at a temperature of about 850° C. to rearrange the internal structure of the refractory metal silicide to a more thermally stable phase species. This results in the structure of FIG. 7, showing therein a resulting film of lightly nitrided refractory metal silicide 50, for example $TiSi_2$. The light nitridation in the form of nitrogen atoms 36 remains in the film and at the refractory metal silicide and polysilicon interface.

The light nitridation slows down refractory metal silicide decomposition and blocks long range agglomeration at grain boundaries and at the polysilicon interface at high temperatures. AFM studies have also shown that the resulting structure with a light nitridation exhibits improved fine grain uniformity and surface smoothness. Thermal stability during rapid thermal annealing after the refractory metal strip is also improved. The lightly nitrided refractory metal silicide also acts as an effective diffusion barrier between underlying silicon and later deposited diffusion barrier material.

Figure 8:
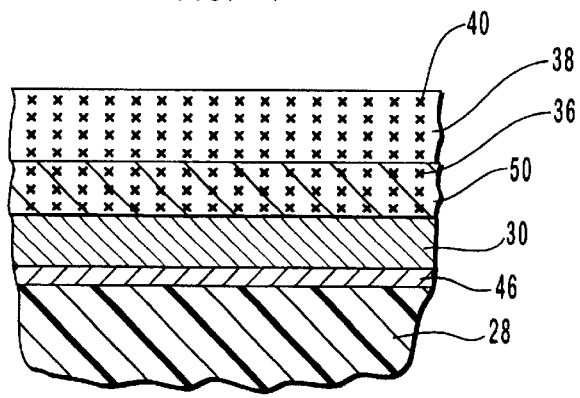
FIG. 8 is a cross-sectional representation of the polysilicon and the refractory metal silicide films of FIG. 7 after undergoing a diffusion barrier material nitride nucleation stage.

The remaining steps comprise forming a diffusion barrier material nitride cover layer above the refractory metal silicide layer. The initial step in this process is illustrated in FIG. 8, and is substantially the same as the diffusion barrier material deposition step described in conjunction with the process for manufacturing diffusion barrier material nitride film disclosed above, involving the physical vapor deposition of a diffusion barrier material film 38 with a light nucleation of diffusion barrier material nitride 40. The diffusion barrier material deposition is conducted at or within the given ranges of the optimum nitrogen content operating level in the environment, in order to result in light and uniform nucleation as described above.

Next, diffusion barrier material nitride grains are grown. The grain growth, as discussed above, is preferably conducted with a rapid thermal nitridation process at a temperature of between about 600° C. and 700° C. The annealing temperature can be substantially lower than 600° C., and may be as low as 400° C., if a high quality atomic nitrogen environment can be maintained.

Figure 9:
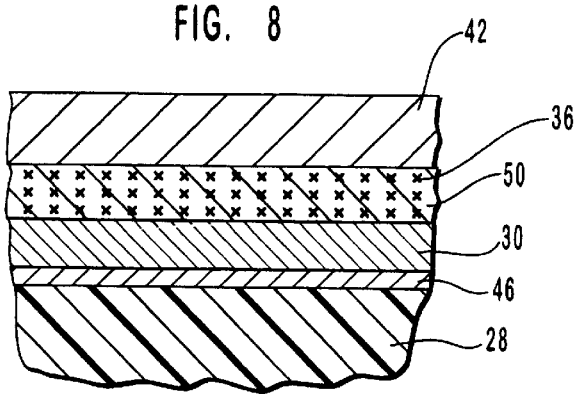
FIG. 9 is a cross-sectional representation of polysilicon, refractory metal silicide, and diffusion barrier material films of FIG. 8 showing the diffusion barrier material film transformed to a nitride of the diffusion barrier material in a grain growth step.
Figure 10:
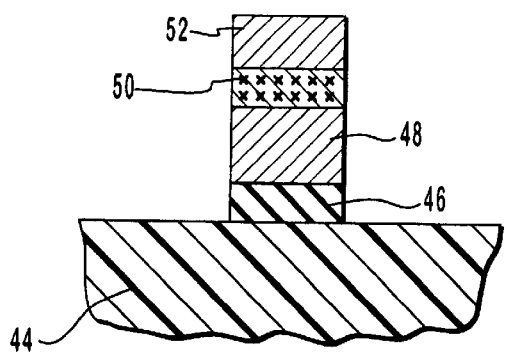
FIG. 10 is a cross-sectional representation of a word line stack incorporating the refractory metal silicide stack with a nitride of a diffusion barrier material covering structure.

A diffusion barrier material nitride cover layer 42 located over a refractory metal silicide stack structure 50, as shown in FIG. 9, results. The diffusion barrier material nitride and refractory metal suicide stack structure is highly suitable for applications such as the formation of local interconnects and word lines. Such a structure is shown in FIG. 10, where a gate region is shown formed with gate oxide layer 46, a polysilicon gate 48, and a refractory metal silicide layer 50 overlying polysilicon gate 48. Diffusion barrier material cover layer 52 is upon refractory metal silicide layer 50.

The use of diffusion barrier material nitride as a cover layer over refractory metal silicide is highly advantageous. Refractory metal silicide layer 50 forms an excellent diffusion barrier during nucleation of diffusion barrier material nitride and subsequent grain growth, while diffusion barrier material nitride cover layer 52 contributes to low resistivity and provides a thermally stable large grain surface with reduced agglomeration and decomposition. The use of diffusion barrier material nitride as a cover layer also makes it unnecessary to completely transform phases of a refractory metal silicide, such as C-49 phase $TiSi_2$ to C-54 phase $TiSi_2$. This is advantageous in certain applications, as doing so is difficult if refractory metal silicide layer 50 is thin. A 100 nm diffusion barrier material nitride layer over a 25–50 nm refractory metal silicide stack has been found to exhibit high temperature stability up to 850° C. in furnace annealing and up to 1000° C. in a rapid thermal anneal in $N_2$.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed is:

1. A process for forming a refractory metal silicide stack with a diffusion barrier material nitride cover layer, comprising:

depositing a layer of a refractory metal on a production silicon surface layer in the presence of nitrogen, the production silicon surface layer being on a semiconductor substrate;

annealing the layer of the refractory metal in the presence of nitrogen to form a layer of a silicide of the refractory metal;

depositing multiple layers of a diffusion barrier material on a test semiconductor substrate in an environment of varying nitrogen content;

determining the barrier material deposition rate as a function of nitrogen content, such that:

the function is monotonically decreasing at least in one interval;

the interval includes a first section and a second section, with the first and second sections having a negative slope; and the first section is connected, as the nitrogen content increases, to the second section at a transition region, the second section having a more negative slope, and the transition region comprising an optimum gaseous nitrogen content operating concentration;

sputtering a layer of the diffusion barrier material over the layer of the silicide of the refractory metal in an environment having approximately 15% of the optimum gaseous nitrogen content operating concentration, wherein the diffusion barrier material includes a material selected from the group consisting of tungsten alloys of Group III and Group IV early transition metals, Mo alloys of Group III and Group IV early transition metals, and mixtures thereof; and growing nitride grains of the diffusion barrier material in the layer of the diffusion barrier material in an environment having a nitrogen content to form a layer of a nitride of the diffusion barrier material, wherein the nitride grains of the diffusion barrier material are approximately of equal size.

2. The process as recited in claim 1, wherein the production silicon surface layer comprises polysilicon.

3. The process as recited in claim 2, further comprising forming a nitridation on the production silicon surface layer.

4. The process as recited in claim 3, wherein forming the nitridation on the production silicon surface layer comprises implanting nitrogen into the production silicon surface layer.

5. The process as recited in claim 1, further comprising implanting phosphorous into the production silicon surface layer.

6. The process as recited in claim 1, wherein the layer of the diffusion barrier material is sputtered at a deposition rate of not less than about 400 Angstroms per minute.

7. The process as recited in claim 6, wherein growing nitride grains of the diffusion barrier material in the layer of the diffusion barrier material comprises a second anneal, the process further comprising, prior to the second anneal and after annealing the layer of the refractory metal, stripping the refractory metal that is unreacted from the layer of the silicide of the refractory metal.

8. The process as recited in claim 1, wherein the point transition region comprises the point where the slope has the greatest rate of change.

9. The process as recited in claim 1, wherein sputtering the layer of the diffusion barrier material over the layer of the silicide of the refractory metal is conducted in an environment within a range of about 3% of the optimum gaseous nitrogen content operating concentration.

10. The process as recited in claim 1, wherein the diffusion barrier material includes a material selected from the group consisting of $Sc_yM_z$, $Zr_yM_z$, $Zr_vSc_yM_z$, $Zr_vNb_yM_z$, $Zr_uSc_vNb_yM_z$, $Nb_yM_z$, $Nb_vSc_yM_z$, $Ti_yM_z$, $Ti_vSc_yM_z$, $Ti_vNb_yM_z$, $Ti_vZr_yM_z$, and mixtures thereof, where M is one of tungsten and molybdenum.

11. The process as recited in claim 1, wherein the grains of the nitride of the diffusion barrier material grown in the layer of the diffusion barrier material have a diameter in a range from about 1000 Angstroms to about 2000 Angstroms and have a crystalline structure.

12. The process as recited in claim 1, wherein:

growing grains of the nitride of the diffusion barrier material comprises heating the layer of the diffusion barrier material in an environment comprising a gaseous nitrogen content;

growing grains of the nitride of the diffusion barrier material further comprises heating the layer of the diffusion barrier material at a temperature up to about 850° C. for a time of up to about 30 minutes in the environment comprising a gaseous nitrogen content; and there is substantially no out diffusion of nitrogen from the layer of the nitride of the diffusion barrier material.

13. The process as recited in claim 1, wherein:

growing grains of the nitride of the diffusion barrier material comprises heating the layer of the diffusion barrier material in an environment comprising a gaseous nitrogen content;

growing grains of the nitride of the diffusion barrier material comprises heating the layer of the diffusion barrier material with a rapid thermal nitridization at a temperature up to about 1000° C. for a time of up to about 20 seconds in the environment comprising a gaseous nitrogen content; and there is substantially no out diffusion of nitrogen from the layer of the nitride of the diffusion barrier material.

14. The process as recited in claim 1, wherein nuclei of the nitride of the diffusion barrier material have a diameter in a range from about 30 Angstroms to about 50 Angstroms.

15. The process as recited in claim 1, wherein the layer of the nitride of the diffusion barrier material has a peak-to-valley roughness of less than about ten percent of the thickness thereof.

16. The process as recited in claim 1, wherein determining the barrier material deposition rate as a function of nitrogen content is performed by plotting the deposition rate of the diffusion barrier material as a function of the varying nitrogen content.

17. The process as recited in claim 1, wherein the optimum gaseous nitrogen content operating concentration is such that nitride nuclei of the diffusion barrier material are uniformly dispersed throughout the sputter layer of the diffusion barrier material, and there is substantially no grain growth of a nitride of the diffusion barrier material in the layer of the diffusion barrier material while sputtering the layer of the diffusion barrier material on the test semiconductor substrate.

18. A process for forming a refractory metal silicide stack with a diffusion barrier material nitride cover layer, the process comprising:

depositing multiple layers of a diffusion barrier material on a test polysilicon surface layer in an environment of varying gaseous nitrogen content;

determining the barrier material deposition rate as a function of nitrogen content, such that:
  the function is monotonically decreasing at least in one interval;
  the interval includes a first section and a second section, with the first and second sections having a negative slope; and
  the first section is connected, as the nitrogen content increases, to the second section at a transition region, the second section having a more negative slope, and the transition region comprising an optimum gaseous nitrogen content operating concentration, wherein at such optimum gaseous nitrogen content operating concentration nitride nuclei of the diffusion barrier material are uniformly dispersed throughout a sputtered layer of the diffusion barrier material, and there is substantially no diffusion barrier material nitride grain growth in the sputtered layer of the diffusion barrier material while sputtering the layer of the diffusion barrier material onto the test polysilicon surface layer;

selecting a first nitrogen content to correspond to within approximately 3% of the optimum gaseous nitrogen content operating concentration;

forming a nitridation on a polysilicon surface layer located on a semiconductor substrate by implanting nitrogen into the polysilicon surface layer;

depositing a layer of a refractory metal on a production polysilicon surface layer in an environment of a carrier gas and gaseous nitrogen;

annealing the layer of the refractory metal in an environment of gaseous nitrogen to form a layer of a silicide of the refractory metal;

depositing a layer of the diffusion barrier material on the layer of the silicide of the refractory metal in an environment comprising an inert gas and the first nitrogen content, wherein there is between about $4 \times 10^8$ to about $4 \times 10^{15}$ nitride nuclei of the diffusion barrier material per $cm^2$ of the diffusion barrier material, and wherein the diffusion barrier material comprises a material selected from the group consisting of tungsten alloys of Group III and Group IV early transition metals, Mo alloys of Group III and Group IV early transition metals, and mixtures thereof; and growing nitride grains of the diffusion barrier material in the layer of the diffusion barrier material in an environment of gaseous nitrogen at a temperature of between about 400° C. and about 700° C. to form a layer of a nitride of the diffusion barrier material.

19. The process as recited in claim 18, wherein nitrogen is implanted into the polysilicon surface layer.

20. The process as recited in claim 18, wherein:

the layer of the diffusion barrier material is deposited at a deposition rate of not less than about 400 Angstroms per minute;

growing nitride grains of the diffusion barrier material in the layer of the diffusion barrier material forms a layer of a nitride of the diffusion barrier material having a peak-to-valley roughness of less than about ten percent of the thickness thereof; and the nitride grains of the diffusion barrier material have a diameter in a range from about 1000 Angstroms to about 2000 Angstroms and have a crystalline structure.

* * * * *

UNITED STATES PATENT AND TRADEMARK OFFICE
CERTIFICATE OF CORRECTION

PATENT NO. : 6,689,685 B2
DATED : February 10, 2004
INVENTOR(S) : Yongjun Hu

It is certified that error appears in the above-identified patent and that said Letters Patent is hereby corrected as shown below:

Title page,
Item [56], References Cited, U.S. PATENT DOCUMENTS, list patents as follows:
-- 5,688,718; 6,080,657; 6,472,264 B1; 6,489,194 B1; 4,782,380; 4,847,111; 4,897,368; 4,927,505; 4,976,839; 5,075,251; 5,162,262; 5,188,979; 5,286,676; 5,318,924; 5,633,200; and 5,665,209. --
FOREIGN PATENT DOCUMENTS, list the following patents -- 3-11735 (A) Japan, 5-347274 (A) Japan --
OTHER DOCUMENTS, list the following:
-- Lin J. et al., *Aluminum Contact Filling and Planarization With Pulsed Laser*, Materials Research Society, Conference Proceedings ULSI-VII, pp. 535-540, 1992
Shingubara S. et al., *Submicron Hole Filling Characteristics Employing ECR Al Sputtering with High Magnetic Field,* Materials Research Society, Conference Procedings ULSI-VIII, pp. 257-266, 1993
Joshi R.V. et al., *Collimated Sputtering for Refractory Metal Liners for Sub-Half Micron Technology*, Materials Research Society, Conference Proceedings ULSI-VIII, pp. 273-279, 1993
Hsieh J.J. et al., *Collimated Liners: Process Modeling and Material Characteristics*, Materials Research Society, Conference Proceedings ULSI-IX, pp. 207-213, 1994
Ramaswami S. et al., *Development of a Coherent Ti/TiN Process for Sub-Half-Micron Technologies*, Materials Research Society, Conference Proceedings ULSI-IX, pp. 215-221, 1994 --
Item [57], ABSTRACT,
Line 12, change "suicide" to -- silicide --

Column 1,
Line 25, delete "an"
Line 58, insert -- an -- before "atmosphere"
Line 66, change "convention" to -- conventional --

Column 8,
Line 17, change "than" to -- that --

UNITED STATES PATENT AND TRADEMARK OFFICE
CERTIFICATE OF CORRECTION

PATENT NO.     : 6,689,685 B2
DATED          : February 10, 2004
INVENTOR(S)    : Yongjun Hu It is certified that error appears in the above-identified patent and that said Letters Patent is hereby corrected as shown below:

Column 9,
Line 35, change "suicide" to -- silicide --

Column 10,
Line 49, change "suicide" to -- silicide --

Signed and Sealed this

Twenty-ninth Day of June, 2004

JON W. DUDAS
*Acting Director of the United States Patent and Trademark Office*